United States Patent [19]
Kazle

[11] Patent Number: 5,847,930
[45] Date of Patent: Dec. 8, 1998

[54] EDGE TERMINALS FOR ELECTRONIC CIRCUIT MODULES

[75] Inventor: Scott J. Kazle, Mound, Minn.

[73] Assignee: HEI, Inc., Victoria, Minn.

[21] Appl. No.: 542,896

[22] Filed: Oct. 13, 1995

[51] Int. Cl.⁶ ............................... H01L 23/28; B32B 3/02
[52] U.S. Cl. ..................... 361/736; 361/772; 361/773; 361/820; 257/692; 257/693; 257/698; 257/724; 257/787; 174/52.2; 29/855
[58] Field of Search ................................ 361/735, 736, 361/760, 772–774, 807, 809, 820; 257/692, 693, 723, 724, 787, 698; 174/52.4, 52.2; 29/841, 855, 856

[56] References Cited

U.S. PATENT DOCUMENTS

| | | | |
|---|---|---|---|
| 5,266,739 | 11/1993 | Yamauchi | 257/787 |
| 5,309,326 | 5/1994 | Minoru | 361/760 |
| 5,455,384 | 10/1995 | Ichihara | 174/52.2 |
| 5,500,628 | 3/1996 | Knecht | 361/820 |
| 5,635,669 | 6/1997 | Kubota et al. | 361/735 |
| 5,714,239 | 2/1998 | Maeda et al. | 361/772 |

FOREIGN PATENT DOCUMENTS 2-201946 A  8/1990  Japan ..................... 257/787

*Primary Examiner*—Leo P. Picard
*Assistant Examiner*—John B. Vigushin
*Attorney, Agent, or Firm*—Schwegman, Lundberg, Woessner & Kluth, P.A.

[57] ABSTRACT

Improved edge terminals for electronic circuit modules such as single- or multi-chip modules and hybrid circuits, and methods of making the edge terminals are disclosed. The improved edge terminals are formed on the edges of the modules, where they do not take up appreciable surface area from the module, and are formed of heat resisting metal and are of larger size as compared to conventional surface terminal pads which simplifies making connections to the module. In one embodiment, ends of pins are inserted in holes in a substrate along lines which will be the edges of the finished modules. After encapsulating in epoxy, the substrate is cut along the lines to bisect the pins, leaving the halves of the pins as embedded terminals flush with the edge of the module. In another embodiment, terminals are formed by attaching the terminal pieces to pads on the substrate, either in the form of widened zones in a grid structure, or an array of terminal plates. The grid or plates are cut through after encapsulation, bisecting the terminals to form the embedded terminals flush with the edge of the module.

6 Claims, 16 Drawing Sheets

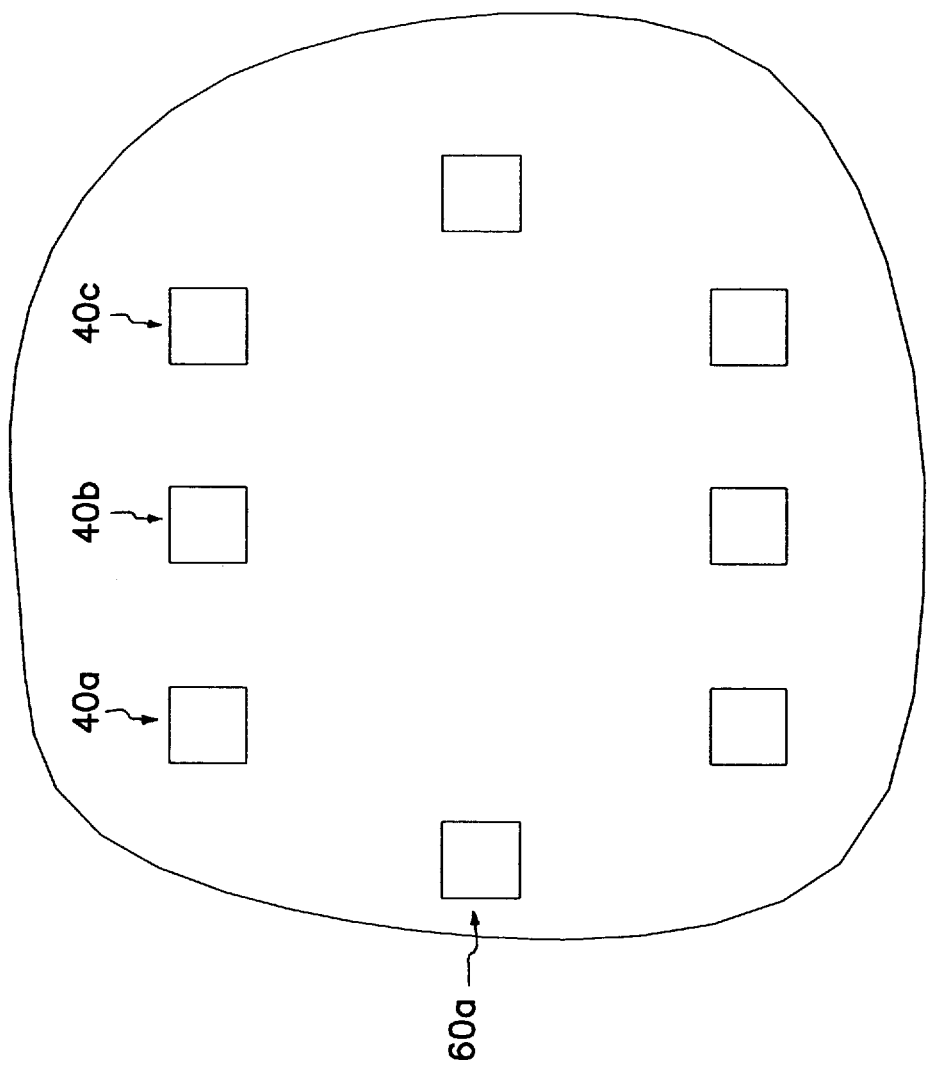

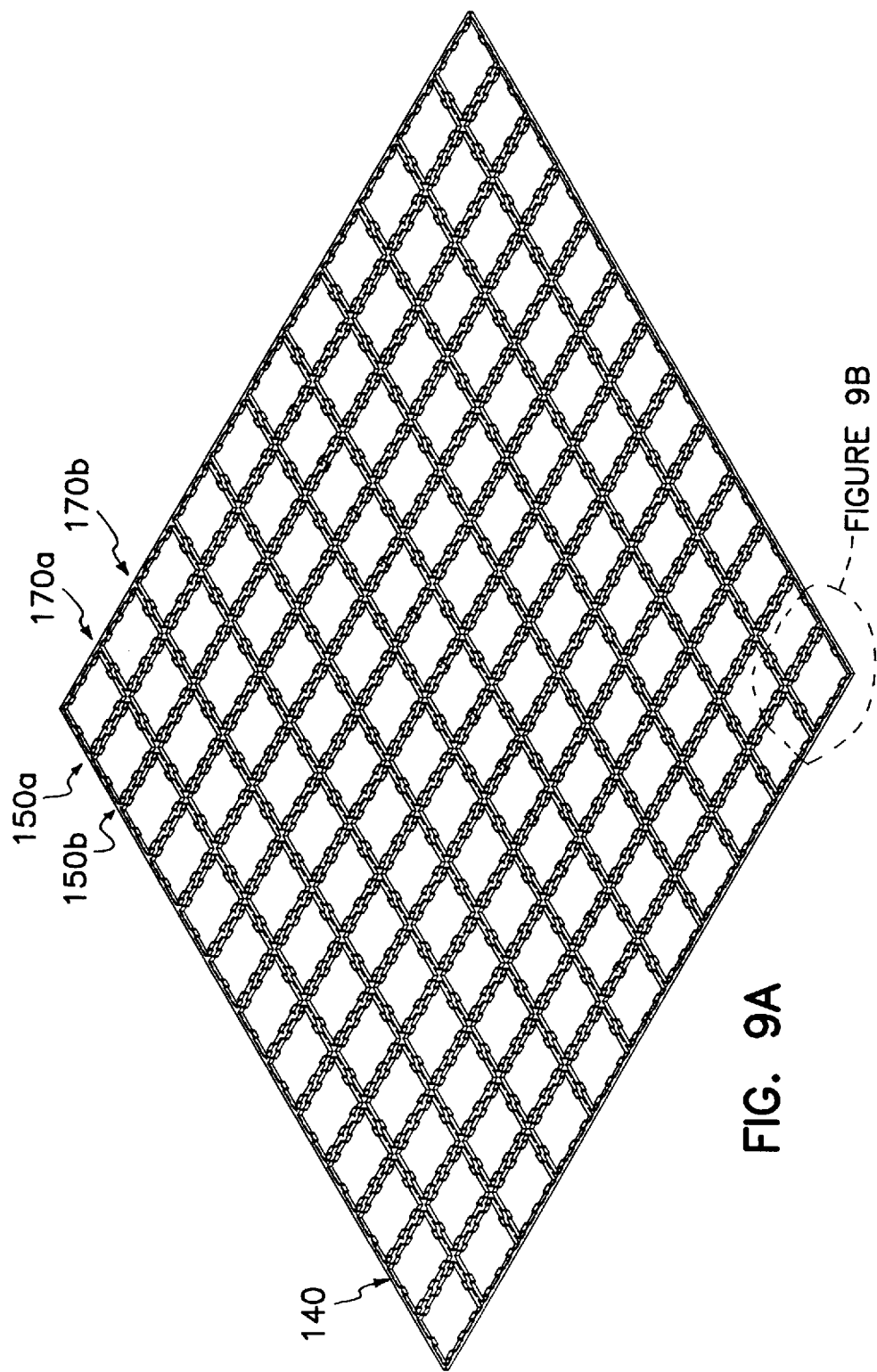

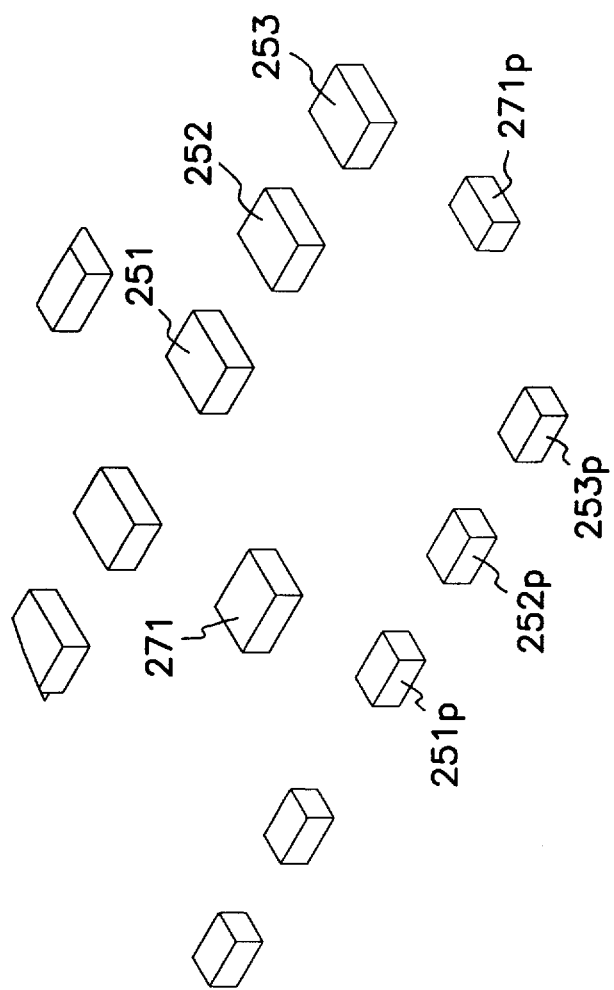

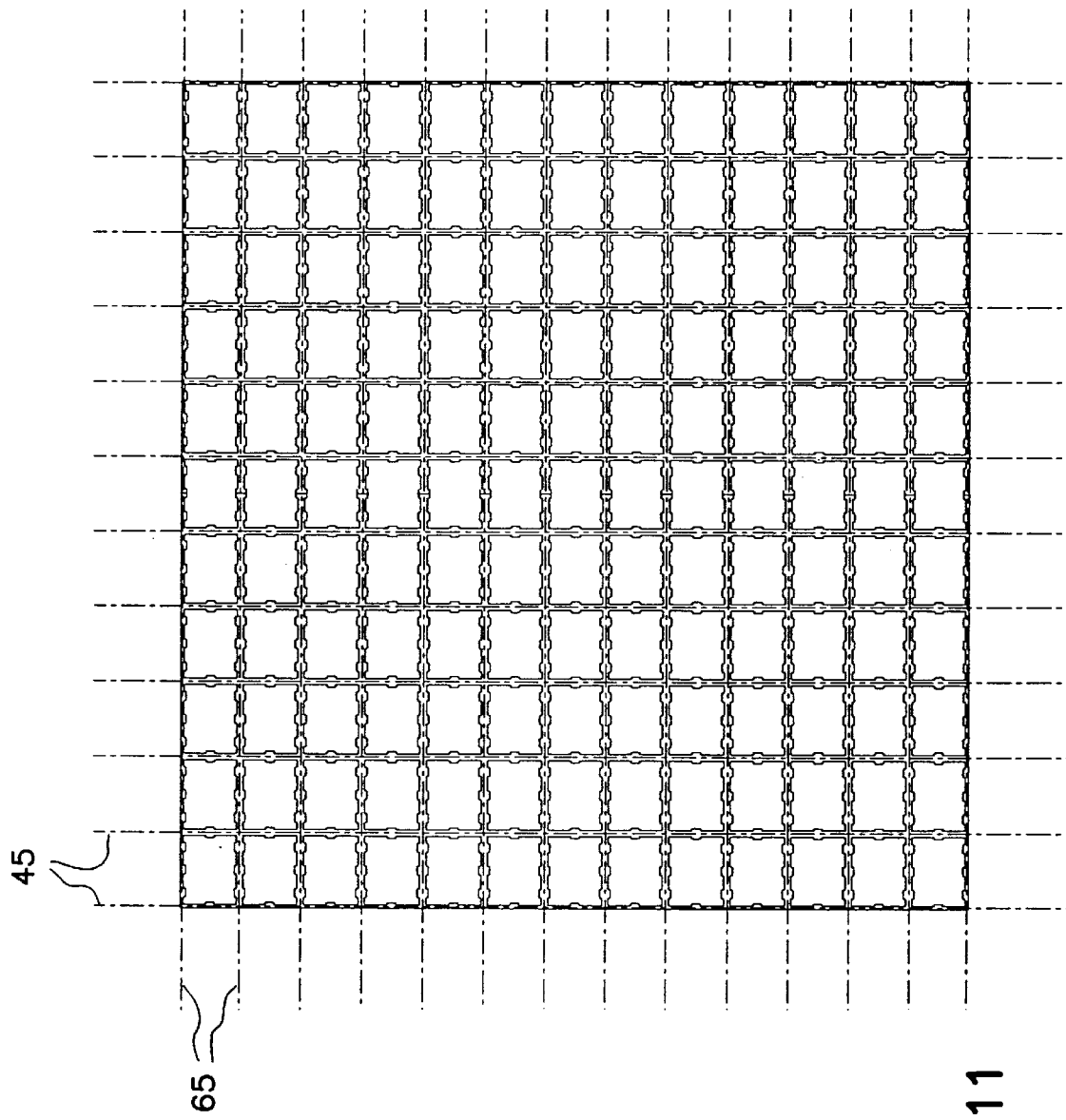

EDGE TERMINALS FOR ELECTRONIC CIRCUIT MODULES

FIELD OF THE INVENTION

The present invention pertains to the field of electronic modules, including single or multi-chip modules and hybrid circuits, and methods for fabrication of such modules. Specifically, the invention pertains to improved edge connectors for such modules, which are formed of heat resistant metal, flush along the edge of the module, which permit a reduction in physical size of the module, and simpler and more reliable connections to the module during assembly or reassembly of the module on a circuit board or other support where the module will be used.

BACKGROUND OF THE PRIOR ART

One general type of circuit module in widespread use today involves one or more integrated circuit (IC) chips and possibly additional discrete components mounted on a substrate which has metalization and multilayer interconnects, with the assembly potted in epoxy. Such circuits are often referred to as electronic modules, multi-chip modules (or single-chip modules) or hybrid circuits. For convenience of terminology herein, such circuits will be referred to as electronic modules, and it will be understood that this term includes single or multiple chip modules, with or without additional discrete components.

Typically, the fabrication of such electronic modules starts with a relatively large substrate on which multiple individual modules will be built up, with the substrate to be subsequently cut into a number of relatively smaller pieces which become the individual electronic modules. The substrate is built up with metalization layers and multilayer interconnects, as is generally known in the art, in order to provide the appropriate interconnects and signal traces according to the function and design purpose for the module. One or more ICs are then mounted on the surface of the substrate and connected to the signal traces. Additionally, in hybrid circuits, discrete components such as capacitors may also be mounted. In one type of commonly used interconnect, the IC has solder bumps on its terminal pads which overlay and contact corresponding signal trace pads on the substrate. The assembly is heated to cause the solder to melt or flow to make a permanent electrical connection. In another commonly used type of interconnect, the ICs are mounted on the substrate, and flying lead wires are applied from terminal pads on the chip to corresponding signal trace pad on the substrate.

The entire side of the substrate on which the chips or the components are mounted is then potted in epoxy, and after the epoxy cures the substrate is cut along predetermined lines to separate the individual modules.

One commonly used technique for applying the epoxy potting material to the module was developed by the assignee of the present invention, and involves forming small ceramic pieces and gluing them all the way around the edge of the substrate to form an dam for the epoxy. The ceramic pieces are formed with a length according to the side dimensions of the substrate, and of a height selected in accordance with the depth or thickness of the intended epoxy layer, so as to contain the epoxy as it is poured onto the surface to cover the ICs and other components. After the epoxy has cured, the cutting process cuts through the entire composite structure, substrate and epoxy, along predetermined paths (generally a grid) to separate the individual circuit modules.

In use, the circuit modules may be bonded or otherwise mounted to a circuit board or other support structure, according to the intended use of the specific application design. Electrical and electronic connections for the module are made to pads formed on the non-epoxied side of the substrate, which connect through internal vias to the appropriate multilayer signal traces and/or the chips, according to the circuit design of the module. Circuit modules produced by this fabrication technique have very good electrical and mechanical properties, and have proven to be very successful and reliable in a great number of applications.

Although the prior art electronic module construction described above has been very successful, it has been appreciated that certain improvements would be desirable in the terminals or interconnects from the module to the circuit board or other application environment in which the circuit module will be used. It would be desirable to have the interconnects on the electronic module larger and more robust, so they are less fragile and easier to connect to. However, making them larger would use up more surface real estate area on the module, and this is usually limited by the fact that there may be a large number of terminals needed in a particular design. As a result, connections to these terminals must be done very carefully in order to avoid damaging, dissolving or overheating the terminal during assembly. Because of these problems, it is usually not possible to rework, reuse or repair such modules, due to the potential for damage to the terminals caused by heating them.

More recently, it has been proposed to provide a terminal along the edge of the electronic module, in the form of recesses or wells filled with solder. According to such proposal, holes are provided through the substrate, positioned in the area which will later be cut when the substrate is cut up into the individual circuit modules. These holes are metalized, and connect to appropriate traces on or in the substrate. The holes are then filled with solder, which adheres to the metalization. The solder-filled holes are then buried along with the chips and other components during the epoxy potting process. As the substrate is cut into the individual modules, the solder-filled holes are bisected, and the cut surfaces then form edge terminals for the individual modules. These terminals are flush with the edge, are formed of solder, and extend partway through the thickness of the module, specifically through the substrate portion, but not the overlaying epoxy portion. Edge terminals provide the advantage of not requiring surface area on the electronic module for interconnection, which allows for a smaller electronic module. However, such terminals still are small and difficult to connect to, and they can dissolve away if they are overheated, or if there are multiple heatings, for example, during an attempted rework or repair.

To overcome these and other problems, the present invention has provided an improved type of edge terminal construction for small electronic modules, which provide flush edge connections to thereby reduce the need for surface area and permit a smaller module, but which are robust, relatively simple to connect to, and which can withstand overheating, and multiple heating for rework or repair.

SUMMARY OF THE INVENTION

These and other objects are accomplished by providing an improved edge terminal for a circuit module, consisting of bars of substantially heat resisting metal embedded along the edge and flush with the edge of the circuit module. The heat resisting metal is a metal which is not solder or any other material that melts at normal soldering temperatures. In one embodiment, the terminal extends substantially through the full thickness of the circuit module. This embodiment is preferably made by forming holes in the substrate along the paths where the cutting will take place to separate the individual modules, placing pins or bars, preferably of copper or some other heat resistant metal, in the holes in contact with traces therein or thereon, and epoxying them in place in the otherwise standard potting process. When the cut is made, it is made through the center of such a pin or bar, essentially bisecting it, so that half goes with and forms an edge connector for one module, and the other half forms an edge connector for the adjacent module.

According to another embodiment of the invention, the heat resistant metallic terminal extends along the edge, flush therewith, for substantially the thickness of the potting material. This embodiment is formed by placing bars or pins on the substrate prior to potting. These bars are soldered or otherwise attached to conductive trace paths on the surface of the substrate, or in recesses formed therein, and essentially straddle the zones or lines where cutting will eventually take place. After potting, the individual circuit modules are separated by cutting through the bars or pins, leaving part of a bisected bar as a terminal for one circuit module, and the other part for another one.

These and other advantages of the present invention will become apparent from the following detailed description of the preferred embodiments of the invention.

BRIEF DESCRIPTION OF THE DRAWING

In the drawing.

FIGS. 2–7 illustrate various steps in the formation of circuit modules of FIG. 1 from a large substrate which is subsequently cut into the individual modules; Specifically.

FIG. 3B is a view at an enlarged scale of a detail of FIG. 3A;

FIG. 5 is a view showing terminal bars assembled on the substrate for the encapsulation step;

FIG. 6 shows a substrate after encapsulation;

FIG. 7 shows the sawcut paths over the substrate to separate the individual circuit modules;

FIG. 9A is a view of a lead frame used in forming edge terminals according to this alternate embodiment;

FIG. 9C is a view similar to FIG. 9B of a detail of a variation of the alternate embodiment;

FIG. 11 is a diagram showing the sawcut paths of the finished substrate to form the individual circuit modules.

DETAILED DESCRIPTION OF THE PREFERRED EMBODIMENT

Figure 1:
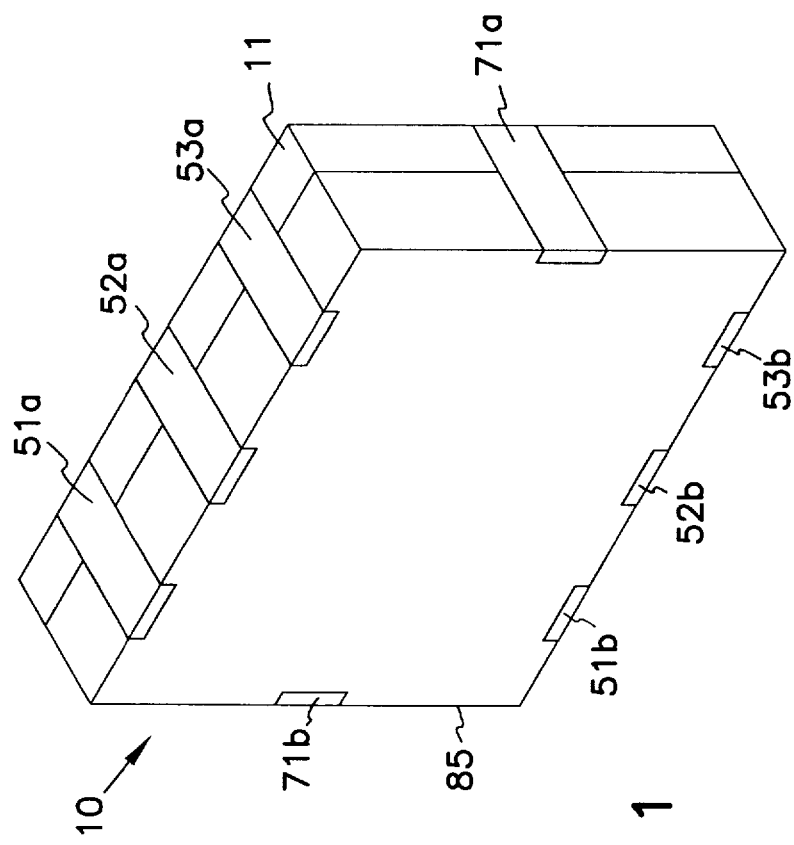
FIG. 1 is a view in perspective, at an enlarged scale, of a circuit module having edge terminals, according to one embodiment of the invention.

With reference now to FIG. 1, an individual circuit module according to the present invention is shown, at an enlarged scale. As seen in FIG. 1, module 10 includes a substrate 11, encapsulant 85, and is generally of a rectangular shape, having been cut by sawing process from a larger substrate in which an array of cut modules can be formed. The substrate may be formed of ceramic, epoxy glass, or any other substrate material as may be used in electronic fabrication. Substrate 11 includes multilayer signal traces as is generally known in the art, and various components including one or more ICs and possibly external resistors or capacitors are mounted on one or both sides of substrate 11, but are not visible in the finished module in FIG. 1, because they are potted or covered by the encapsulant 85.

Module 10 also includes a number of edge terminal connectors according to the present invention. Specifically, terminals 71a and 71b are provided on opposite ends thereof, and terminals 51a, 52a, 53a are provided on one side, and 51b, 52b, and 53b on the opposite side. In each case, the terminal consists of a metal structure embedded in both the encapsulant 85 and substrate 11, and flush with the outer edges of the module. These terminals provide electrical connections between the circuit module and a circuit board or other structure (not shown) with which the module was intended to be used.

Substrate 11 preferably has multilayer signal traces as is generally known in the art, to form the necessary interconnections among the components thereon, and the external edge terminals. Each edge terminal 71a, 71b and 51–53, a–b, is connected to signal traces in or on substrate 11 according to the logic design of the particular module.

Figure 2A:
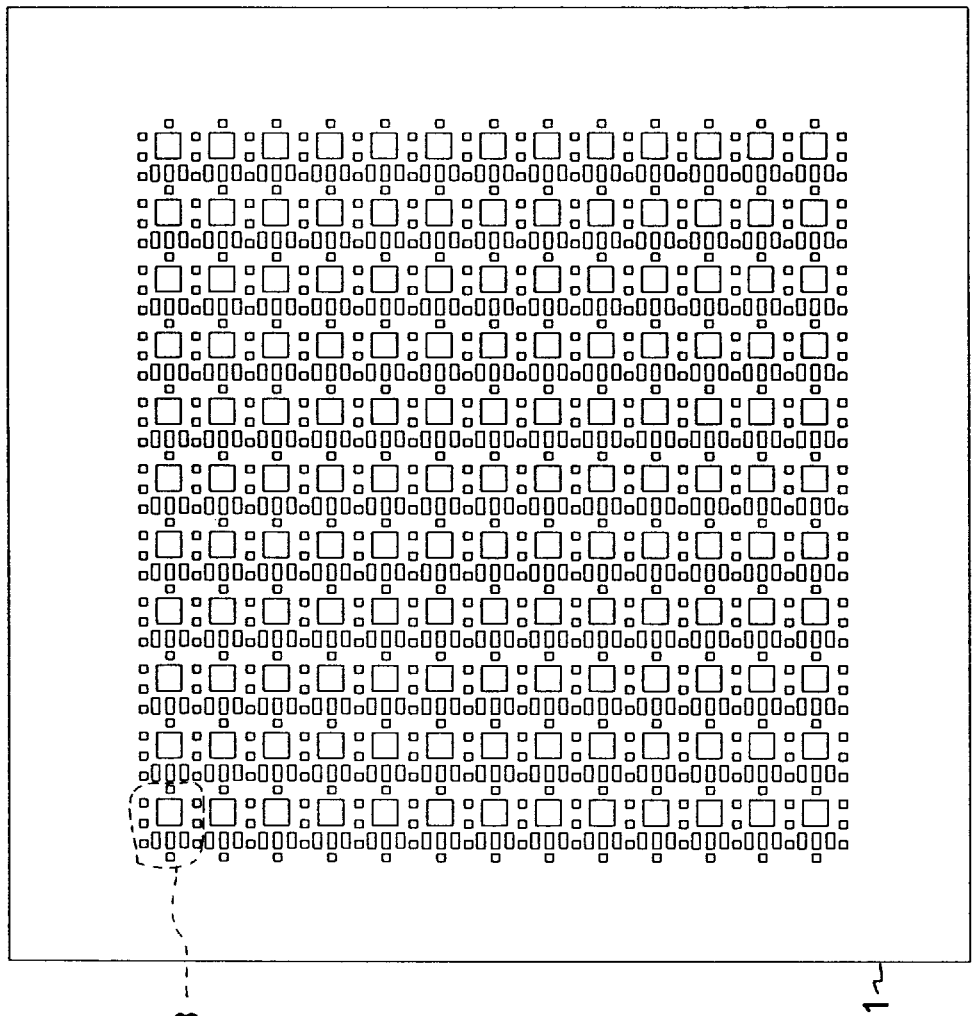
FIG. 2A is a plan view of a large substrate showing an array of individual cells, which will correspond to the individual circuit modules, each cell having circuit components and being bordered by rows and columns of mounting holes.
Figure 2B:
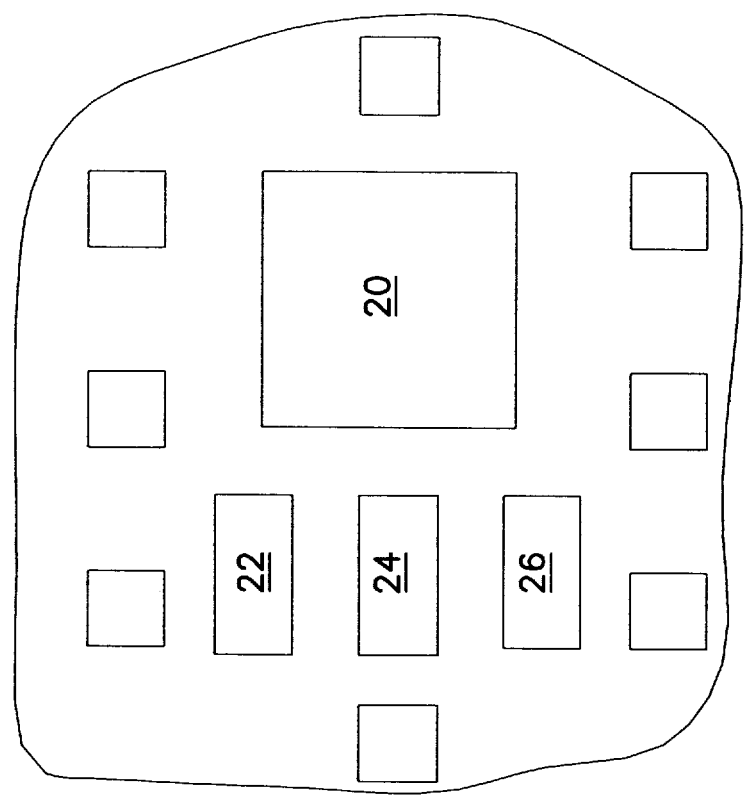
FIG. 2B is a view at enlarged scale of a detail of FIG. 2A.

FIGS. 2A and 2B show a larger substrate 111, which is built up with an array or large number of individual circuits, which will subsequently be cut into individual modules. As seen in FIGS. 2A and 2B, each circuit module or cell includes an IC 20, and additional discrete resistor or capacitor components 22, 24, 26. These components connect through known techniques to signal trace paths and holes provided in a substrate, as is generally known in the prior art, in accordance with the particular circuit function design for the modules. The individual circuit cell is repeated a large number of times over the entire substrate 111, so that the module cells form regular columns and rows, to aid in subsequent separation by cutting.

Figure 3A:
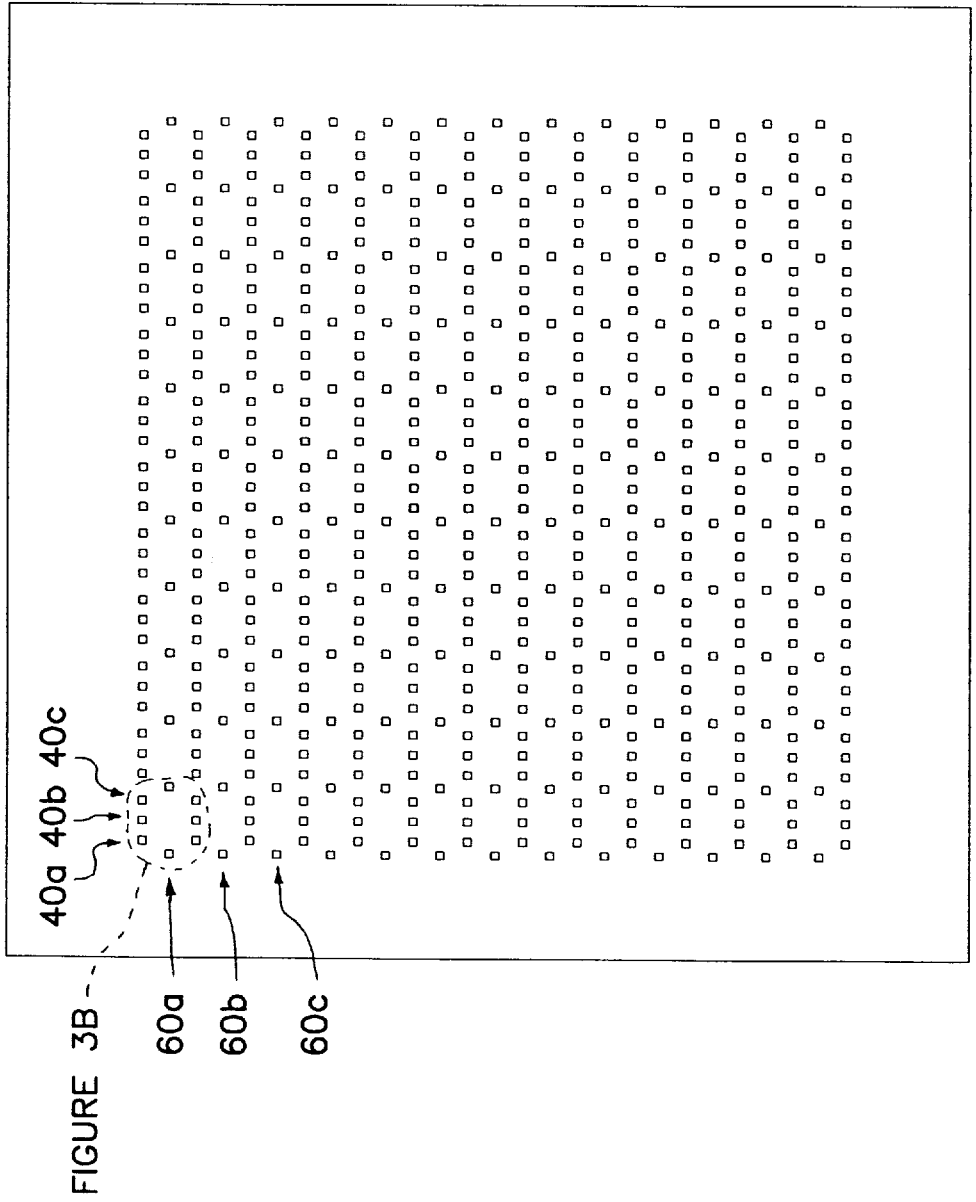
FIG. 3A is a view similar to FIG. 2A, but without components installed, showing the mounting hole patterns.

Also visible in FIGS. 2A and 2B are the rows and columns of holes for use in forming the edge terminal. These are seen better in FIGS. 3A and 3B, which are similar to FIGS. 2A and 2B, but without the components. A plurality of horizontal (in the orientation of FIG. 3A) rows are made up of a series of holes 40a, 40b, 40c, and so on, which are provided along the boundary between adjacent rows of module cells. Similarly, vertical columns of holes 60a, 60b, 60c and so on are provided in columns on the separation between adjacent module cells. It will be understood that the use of the terms 'row' and 'column' is somewhat arbitrary, as they can be used interchangeably depending upon the orientation, and are adopted for convenience of terminology, and not in any limiting sense.

In the preferred embodiment shown, the rows of holes 40 include three individual holes along each side of the cell. These holes will eventually correspond to the terminals 51, 52, 53 on either side of a finished circuit module. Similarly, the columns of holes 60 provide a single hole on each end of a module area, and will correspond to the edge terminals 71 of the finished module (please see FIG. 1). It will be appreciated that the number of holes on the sides or end can vary according to the size and circuit requirements of the individual module design, and the preferred embodiment showing three on two sides and one each on the other side is only by way of example, and not limitation.

The individual holes 40, 60 in the rows and columns are formed in the substrate according to a predesigned pattern, and the holes intersect signal traces on or within the multilayer structure on the substrate according to the circuit design.

Figure 4A:
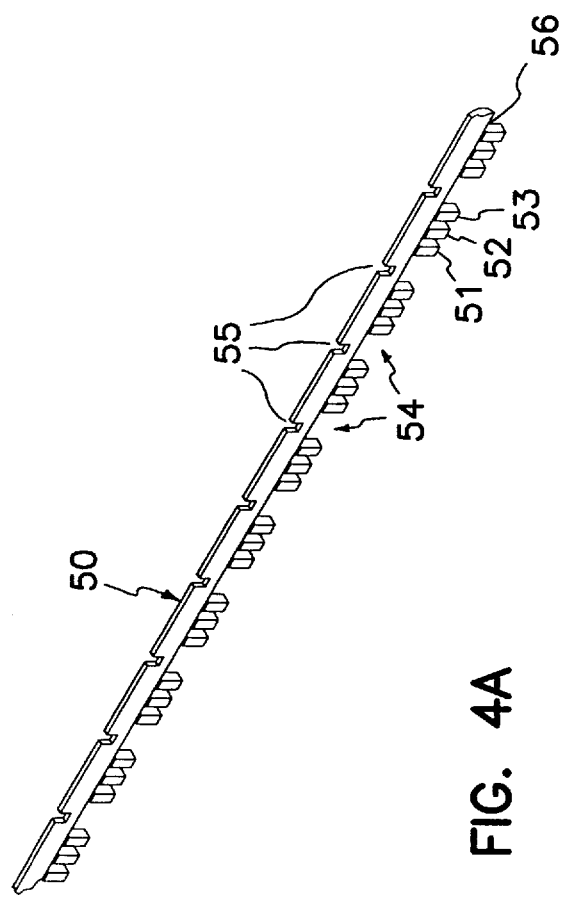
FIGS. 4A and 4B show sections of terminal bars, horizontal and vertical, respectively, used in the embodiment of FIGS. 1–7 to form edge terminals.
Figure 4B:
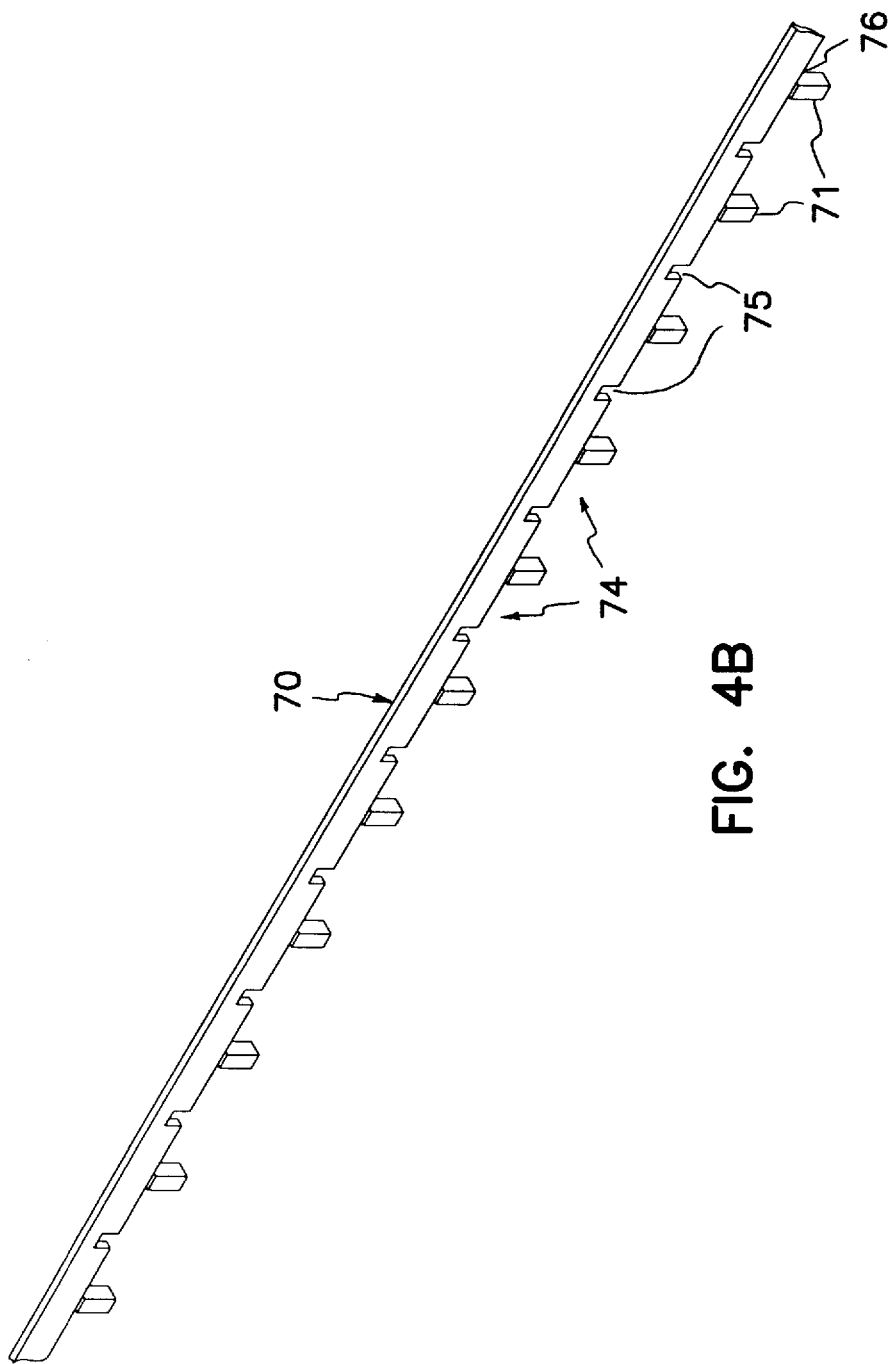
Figure 5:
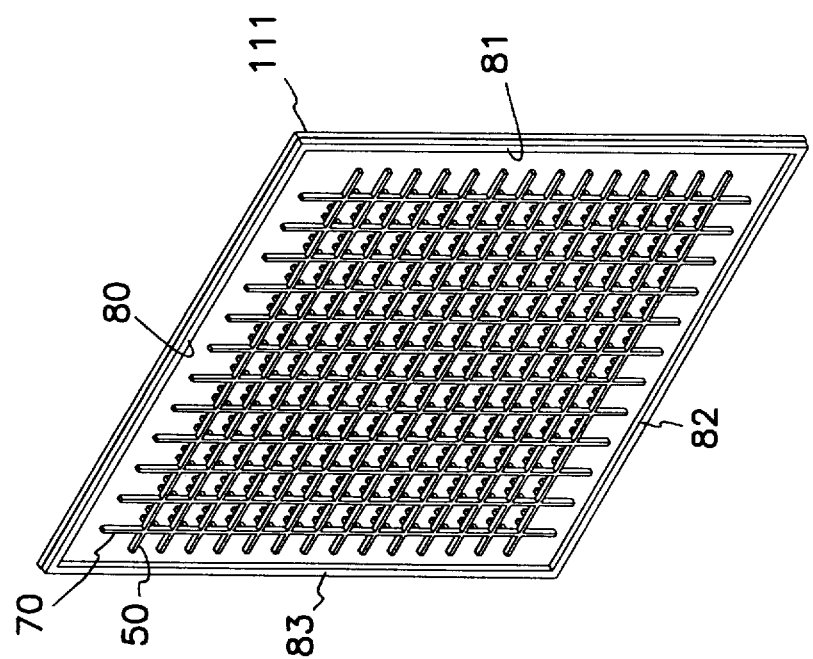

FIGS. 4A and 4B show, at an enlarged scale, bar structures that are used to form the edge terminals. These bars are long enough to stretch across the width of the array of circuit cells on substrate 111, and interlock to form a grid aligned with the rows and columns of holes 40, 60, thereby forming a perimeter around individual cells, as shown in FIG. 5.

FIG. 4A shows details of a horizontal bar 50, a plurality of which are needed to cover substrate 111. Each bar 50 is an elongate barlike structure made of a durable metal such as copper, nickel or zinc, to which solder will adhere. As seen in FIG. 4A, an upper edge of bar 50 has a plurality of clearance/interlock notches 55, at regular intervals according to the pitch or width of the circuit cell size. The other edge of bar 50 has a plurality of posts 51, 52, 53, separated by gaps 54, which are positioned generally opposite notches 55. The posts 51, 52, 53 are scored or partially etched with a break line at location 56, where they join the main part of the bar. The break line is used to break the grid away after encapsulation, as described below. Horizontal bars 50 are configured for placing along the rows, with the posts 51, 52, 53 of each group fitting in the group of corresponding holes 40a, 40b, 40c, etc. in the rows of the substrate 111 (see FIG. 3).

Vertical bars 70, as shown in FIG. 4B, are generally similar to horizontal bars 50, but are designed to fit with their posts 71 in the columns of holes 60a, 60b, 60c, etc. Bars 70 have gaps 74 at intervals corresponding to the pitch or spacing of the circuit cells, with an individual post 71 positioned therebetween to fit into the holes. A break line at location 76 is provided for each post 71, in the same manner as the break lines 56 of the bars 50. Of course, in different designs, there may be an additional number of posts in this location. A clearance/interlock notch 75 is provided in each gap 74. Notch 75 in vertical bar 70 cooperates and interlocks with notches 55 and horizontal bars 50, so that a plurality of parallel spaced bars 50 can interlock with a number of parallel spaced vertical bars 70 to form a grid of bars as shown in FIG. 5.

After the bars are in place, solder is flowed around and/or into the holes 40, 60, to surround and/or fill around all of the individual posts 51, 52, 53, and 71, around each circuit cell over the entire substrate.

Figure 6:
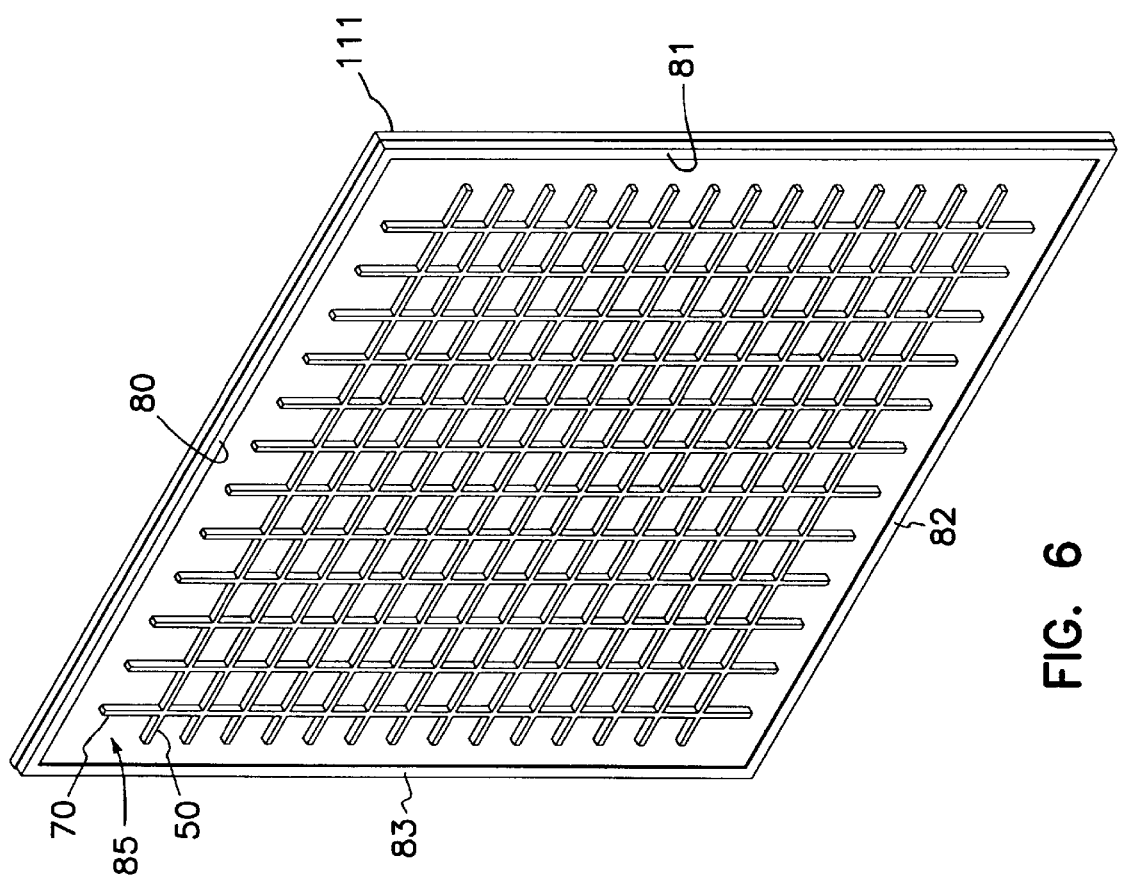

Epoxy dams are formed and attached around the edge of the substrate as shown in FIG. 5. Specifically, dams 80 and 82 are attached on opposite sides, and 81 and 83 are attached on the other opposite sides, to form a contiguous dam or barrier having the desired height above substrate 111 for flooding with epoxy encapsulant. This results in a structure as appears in FIG. 6, after the encapsulant has been poured, covering all of the components of the individual circuit cell, and extending partway up on the bar grid. The portions of the bar grid extending above the encapsulant are removed at the breaklines 56, 76 which are shown on FIGS. 4A and 4B.

Figure 7:
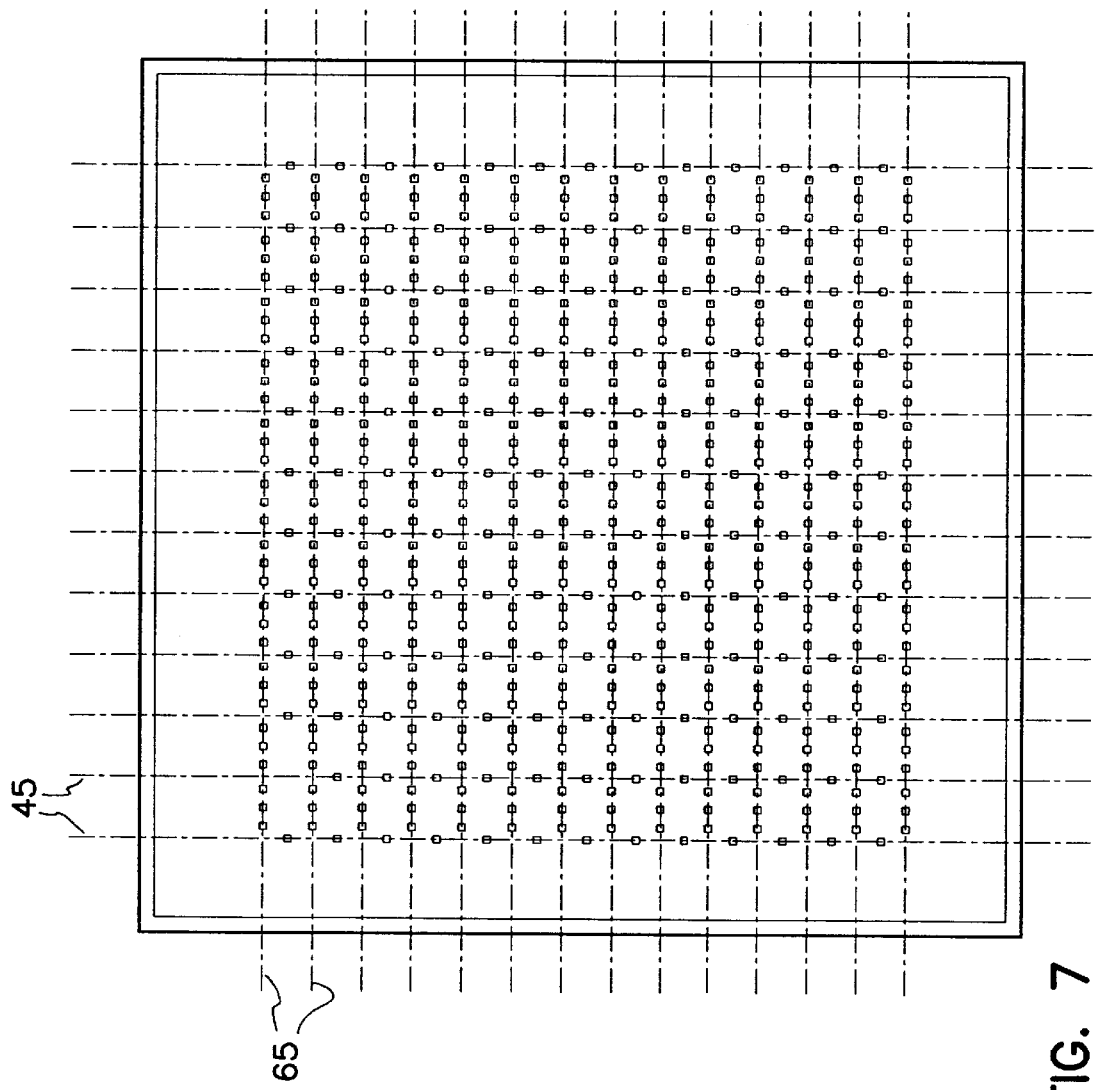

The substrate is then cut along the plurality of perpendicular sawcut paths 45, 65, as shown in FIG. 7, which bisect each of the horizontal and vertical bars. This not only separates the overall substrate and assembly into individual circuit modules, but also cuts through each of the terminal bars, leaving only separate halves of the posts 51, 52, 53 as the embedded edge terminal 51a, 52a, 53a, and 51b, 52b, 53b, of FIG. 1. Similarly, the vertical bars are cut through in this process, leaving separated halves of posts 71 on the embedded edge terminal 71a, 71b of FIG. 1. Since these edge terminals are soldered to appropriate signal traces within or on substrate 11, and since they are secured both by being soldered in substrate 11 and surrounded by encapsulant 85, they are very durable electrical edge connections for the individual module.

In the embodiment shown in FIG. 1, eight edge terminals are provided. It will be appreciated that in the prior art structure wherein the terminals would be provided by pads on a face of the substrate, there would be limited surface area available for each terminal. Also, because such terminals would be markedly small and in tracelike structures, they would be subject to heat damage, mentioned above, in the case of soldering or reworking. In contrast, the edge terminals of the embodiment of FIG. 1 provide a more substantial mass of metal to be attached to without damage, and therefore provide for a more robust, compact circuit module.

An alternate embodiments is shown in FIGS. 8–11. The module seen in FIG. 8 has a rectangular solid configuration, with substrate 12, an encapsulant 85, as in the previous embodiment. The substrate 12 may be generally similar to substrate 11 of the first embodiment, but the configuration will differ in the manner of attachment of terminals, as explained below. The terminal 151a, 152a, 153a, and 171a, are seen provided on module edges for external connection. It will be understood that corresponding edge terminals 151b, 152b, 153b, 171b, are provided on the other two edges not visible in the orientation of FIG. 8 because they do not extend through the encapsulant. In this embodiment, the edge terminals are again flush with the sides and edges of the module, and embedded in the encapsulant, but not in the substrate. The terminals abut the surface of the substrate and are connected to appropriate signal traces thereon.

Figure 8:
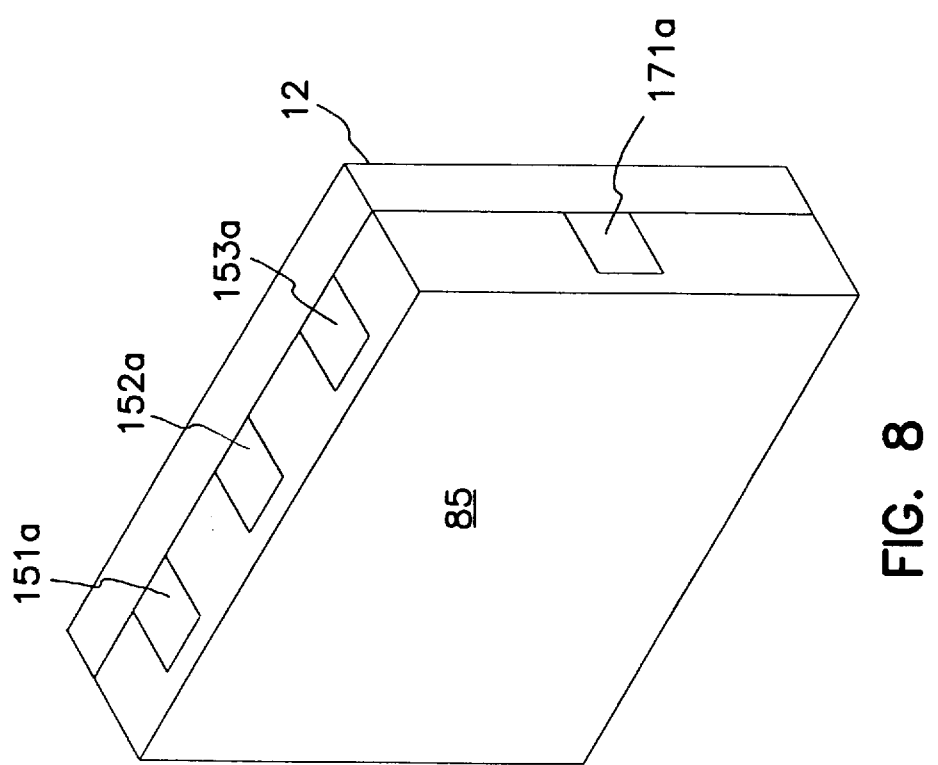
FIG. 8 is a view similar to FIG. 1 of a circuit module, having a different type of edge terminal according to an alternate embodiment of the invention.
Figure 9B:
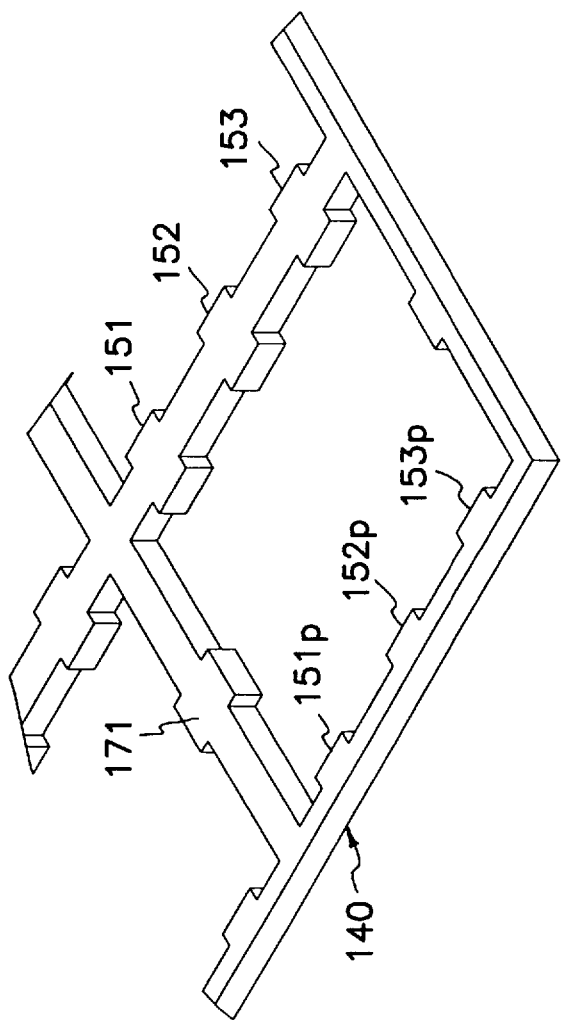
FIG. 9B is a view at an enlarged scale of a detail of FIG. 9A.

This embodiment is also formed on a large substrate having the circuit design and component repeated in a number of rows and columns of circuit cells which will later be cut and divided. This embodiment does not use mounting holes for the terminals, but instead makes use of a lead frame 140 as indicated in FIGS. 9A and 9B. The lead frame is formed of a durable conductive material to which solder will easily adhere. It has a number of horizontal rows 150a, 150b etc., and vertical columns 170a, 170b, etc. The actual number of columns and rows depends on the particular design. The spacing of the grid corresponds to the circuit cell dimension, such that the lead frame grid columns and rows will be positioned exactly over the cut line to separate the circuits. Each row portion 150 of lead frame 140 includes three widened zones 151, 152, and 153. These will correspond to the edge terminals 151–153, a,b, in the final module as shown in FIG. 8. Similarly, each of the column portions 170 of the lead frame have a widened zones 171, which will correspond to the edge terminals 171a, b in the finished module. The perimeters of the lead frame can have half-width zones 151p, 152p, 153p and 171p, as they will form terminals on one module only, not two adjacent modules.

Lead frame 140 is placed over the substrate, with the columns and rows of the lead frame exactly on the dividing lines which will be cut. They are then soldered so that the widened zones 151, 152, 153, 171 are electrically connected to tabs provided for that purpose for traces on the substrate.

As an alternative to lead frame 140, small terminal plates or structures 251, 252, 253, and 271 may be provided directly without a lead frame. These terminal plates are also made of durable conductive material to which solder will easily adhere. The arrangement of the terminal plates is shown in FIG. 9C, which is at the same scale and orientation as FIG. 9B, so that the correspondence can be seen between the widened zones on the grid and the terminal plates. In the alternative embodiment of FIG. 9C, the terminal plates are placed on tabs provided for that purpose for traces on the substrate, preferable by robotic assembly in the same manner as components. They are soldered in place to make mechanical and electrical contact with the pads. They will subsequently be cut after encapsulating, as described below. Half-width terminal plates 251p, 252p, 253p, and 271p may be used for terminals around the perimeter of the substrate 112.

Figure 10:
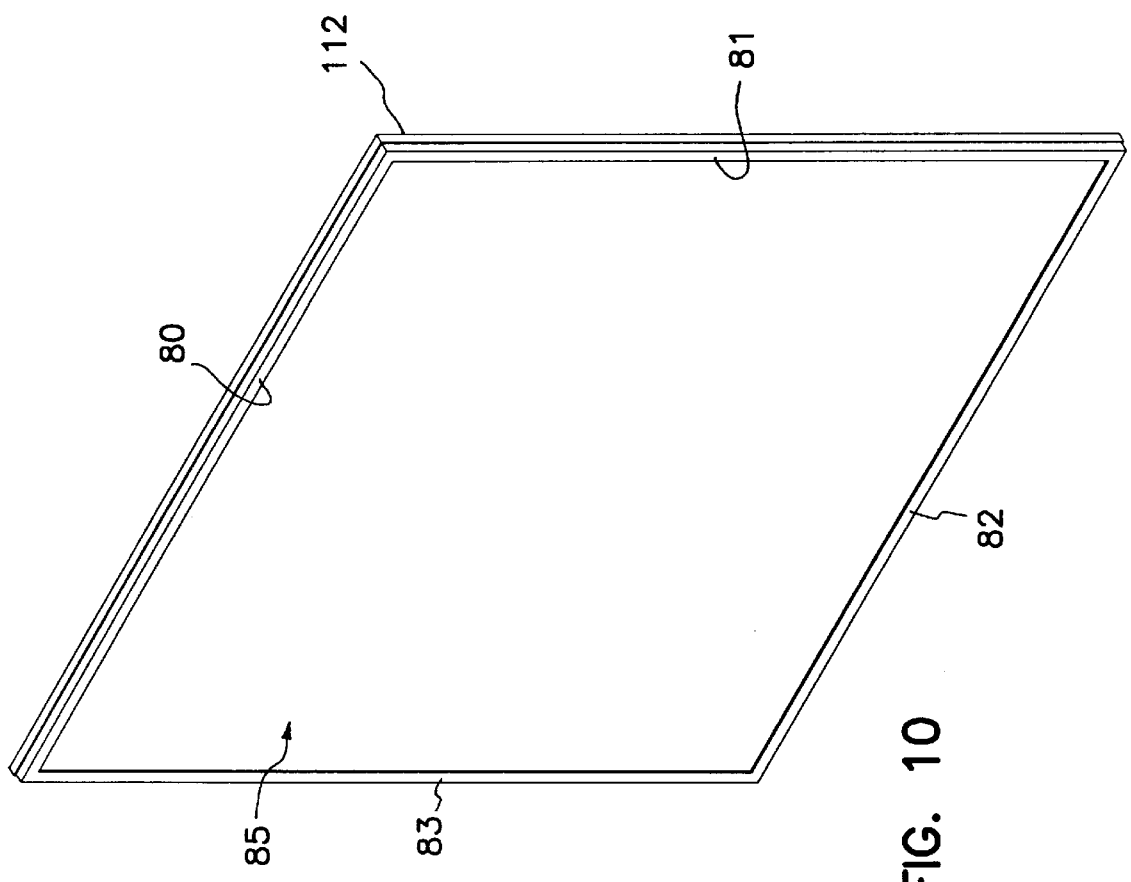
FIG. 10 is a view of the encapsulation step of this alternate embodiment.

The epoxy dams are then placed around the substrate as in the first embodiment previously described, and epoxy or other encapsulant is poured in, covering components on the substrate (not shown) and the lead frame 140, indicated in FIG. 10, if one is used. The substrate is then cut along the sawpath indicated in FIG. 11, that is, down each of the rows 150 and columns 170 of lead frame 140, which is at this point embedded within the encapsulant. The width of the saw cut blade, in comparison with the width of the lead frame rows and columns, is such that the saw cut blade consumes and eliminates the entire lead frame, except for the edges of the widened zones 151, 152, 153, and 171, each of which is bisected to form edge terminals on adjacent circuit modules as they are being cut. If no lead frame is used, the saw cut blade separates the terminal plates 251, 252, 253, and 271, each of which is bisected to form edge terminals on adjacent circuit modules as they are being cut.

The resulting circuit module, as shown in FIG. 8, again has the advantage of edge terminal placement, rather than requiring surface placement of connections, thereby allowing for greater miniaturization. Also, the edge terminals, while not as long or massive as those in the embodiment of FIG. 1, are still made of a substantial piece of metal, rather than a trace, and are therefore more robust and durable in manufacturing or reworking processes than prior art designs.

It will be appreciated from the foregoing that the present invention provides an improved edge terminal construction for small circuit modules, and methods for making same, which provide the advantages of greater miniaturization, and greater durability of the terminals.

I claim:

1. An improved circuit module, comprising:
   a generally planar substrate having a surface and having an edge, the substrate having conductive traces including at least one pad area adjacent the edge of the substrate;
   at least one electrical component mounted on said substrate;
   a heat resistant metallic terminal element in contact with the pad and having an external surface aligned with the edge of the substrate and flush therewith, said terminal element connected electrically to said module to form an external terminal therefor;
   a layer of potting material covering the surface of the substrate and the component and partially surrounding the terminal element, the potting layer having a surface aligned and flush with the edge of the substrate and with the external surface of the terminal element; and
   wherein said terminal element is in contact with a pad in a recess in the edge of the substrate and extends at least partially through the thickness of both the substrate and the potting layer with its external surface flush with the edges of both.

2. An improved circuit module, comprising:
   a generally planar substrate having a surface and having an edge, the substrate having conductive traces including at least one pad area adjacent the edge of the substrate;
   at least one electrical component mounted on said substrate;
   a heat resistant metallic terminal element in contact with the pad and having an external surface aligned with the edge of the substrate and flush therewith, said terminal element connected electrically to said module to form an external terminal therefor;
   a layer of potting material covering the surface of the substrate and the component and partially surrounding the terminal element, the potting layer having a surface aligned and flush with the edge of the substrate and with the external surface of the terminal element; and
   wherein said terminal element is in contact with a pad on the first surface of the substrate and extends at least partially through the thickness of the potting layer with its external surface flush with the edges of both the potting layer and the substrate.

3. A circuit module array comprising:
   a generally planar substrate;
   an array of circuit patterns formed on the substrate;
   said circuit patterns having conductive traces for connection to components;
   said conductive traces including pads positioned on boundaries between adjacent circuit patterns of the array, with traces extending from at least some of the pads to the circuit patterns on each side thereof; wherein said pads include apertures formed in the substrate along the boundaries between circuit patterns in said array;
   an array of heat resistant metal terminal elements attached to the pads and in electrical contact with traces connecting thereto; wherein said terminal element array includes posts secured in the apertures and extending above the surface of the substrate; and
   a layer of potting material covering at least one surface of the substrate and at least partially covering the array of terminal elements.

4. A circuit module array comprising:
   a generally planar substrate;
   an array of circuit patterns formed on the substrate;
   said circuit patterns having conductive traces for connection to components;
   said conductive traces including pads positioned on boundaries between adjacent circuit patterns of the array with traces extending from at least some of the pads to the circuit patterns on each side thereof; wherein said pads include conductive areas on the surface of said substrate along the boundaries between circuit patterns in said array,
   an array of heat resistant metal terminal elements attached to the pads and in electrical contact with traces connecting thereto wherein said terminal element array includes bar members with flat surfaces in contact with the pads; and
   a layer of potting material covering at least one surface of the substrate and at least partially covering the array of terminal elements.

5. A circuit module array according to claim 4 wherein said terminal element array includes a plurality of individual bars positioned on said pads.

6. A circuit module array according to claim 4 wherein said terminal element array includes a grid positioned over said substrate and at least partially covered by said epoxy layer, said grid having widened portions forming the bars positioned on the pads.

* * * * *